United States Patent
Shin

(10) Patent No.: US 10,862,458 B2
(45) Date of Patent: Dec. 8, 2020

(54) ACOUSTIC WAVE DEVICE AND LADDER FILTER

(71) Applicant: Murata Manufacturing Co., Ltd., Nagaokakyo (JP)

(72) Inventor: Yasuaki Shin, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 6 days.

(21) Appl. No.: 16/258,712

(22) Filed: Jan. 28, 2019

(65) Prior Publication Data

US 2019/0158063 A1 May 23, 2019

Related U.S. Application Data

(63) Continuation of application No. PCT/JP2017/027312, filed on Jul. 27, 2017.

(30) Foreign Application Priority Data

Aug. 10, 2016 (JP) .................................. 2016-157683

(51) Int. Cl.
*H03H 9/64* (2006.01)
*H03H 9/72* (2006.01)
(Continued)

(52) U.S. Cl.
CPC ...... *H03H 9/6483* (2013.01); *H03H 9/02637* (2013.01); *H03H 9/02992* (2013.01);
(Continued)

(58) Field of Classification Search
CPC ............. H03H 9/6483; H03H 9/02637; H03H 9/02992; H03H 9/145; H03H 9/14591; H03H 9/54; H03H 9/72; H03H 9/725
(Continued)

(56) References Cited

U.S. PATENT DOCUMENTS

| 5,864,262 | A | * | 1/1999 | Ikada | .................... H03H 9/6436 |
| | | | | | 333/193 |
| 2010/0117483 | A1 | * | 5/2010 | Tanaka | ...................... H03H 3/08 |
| | | | | | 310/313 B |

(Continued)

FOREIGN PATENT DOCUMENTS

| JP | 2001-007680 A | 1/2001 | |
| JP | 2001007680 | * 1/2001 | ............... H03H 9/64 |

(Continued)

OTHER PUBLICATIONS

Ikata et al., "A design of antenna duplexer using ladder-type SAW filters", published in the proceedings of 1998 IEEE Ultrasonic Symposium, pp. 1-4. (Year: 1998).*

(Continued)

*Primary Examiner* — Benny T Lee
*Assistant Examiner* — Hafizur Rahman
(74) *Attorney, Agent, or Firm* — Keating & Bennett, LLP

(57) ABSTRACT

An acoustic wave device includes first to third acoustic wave resonators connected in series, and the first acoustic wave resonator and the third acoustic wave resonator are respectively disposed on one side and another side of the second acoustic wave resonator. In the first to third acoustic wave resonators, a first common busbar is connected to one of reflectors of the first and second acoustic wave resonators, and a second common busbar is connected to one of reflectors of the second and third acoustic wave resonators.

18 Claims, 7 Drawing Sheets

(51) Int. Cl.
    *H03H 9/145*     (2006.01)
    *H03H 9/02*     (2006.01)
    *H03H 9/54*     (2006.01)

(52) U.S. Cl.
    CPC ........ *H03H 9/145* (2013.01); *H03H 9/14591* (2013.01); *H03H 9/54* (2013.01); *H03H 9/72* (2013.01); *H03H 9/725* (2013.01)

(58) Field of Classification Search
    USPC ........................................................ 333/193
    See application file for complete search history.

(56) References Cited

U.S. PATENT DOCUMENTS

| | | |
|---|---|---|
| 2011/0095844 A1 | 4/2011 | Tanaka et al. |
| 2017/0201228 A1 | 7/2017 | Kuzushita |
| 2017/0244383 A1* | 8/2017 | Yasuda .................. H01Q 15/14 |

FOREIGN PATENT DOCUMENTS

| | | | |
|---|---|---|---|
| JP | 2003-209459 A | 7/2003 | |
| JP | 2003209459 * | 7/2003 | ............. H01L 41/09 |
| JP | 2004-320412 A | 11/2004 | |
| JP | 2011-172191 A | 9/2011 | |
| JP | 5562063 B2 | 7/2014 | |
| WO | 2009/016906 A1 | 2/2009 | |
| WO | 2010/004686 A1 | 1/2010 | |
| WO | 2016/063718 A1 | 4/2016 | |
| WO | WO-2018117059 A1 * | 6/2018 | ............... H03H 9/72 |

OTHER PUBLICATIONS

RFwireless-world.com, "Difference between SAW filters types IIDT, DMS, Ladder-type". (Year: 2012).*

Official Communication issued in International Patent Application No. PCT/JP2017/027312, dated Oct. 17, 2017.

Official Communication issued in corresponding Japanese Patent Application No. 2018-532932, dated Mar. 3, 2020.

* cited by examiner

US 10,862,458 B2

ACOUSTIC WAVE DEVICE AND LADDER FILTER

CROSS REFERENCE TO RELATED APPLICATIONS

This application claims the benefit of priority to Japanese Patent Application No. 2016-157683 filed on Aug. 10, 2016 and is a Continuation Application of PCT Application No. PCT/JP2017/027312 filed on Jul. 27, 2017. The entire contents of each application are hereby incorporated herein by reference.

BACKGROUND OF THE INVENTION

1. Field of the Invention

The present invention relates to an acoustic wave device including a plurality of one-port acoustic wave resonators, and a ladder filter.

2. Description of the Related Art

Various acoustic wave devices including a plurality of one-port acoustic wave resonators connected in series have been proposed. For example, in Japanese Patent No. 5562063, three one-port acoustic wave resonators are connected in series on a piezoelectric substrate. More specifically, IDT electrodes of the three acoustic wave resonators are connected in series with each other. Furthermore, reflectors disposed on one side of the three acoustic wave resonators in an acoustic wave propagation direction are electrically connected to each other. In the acoustic wave propagation direction, on the other side as well, three reflectors of the three acoustic wave resonators are electrically connected to each other.

In each acoustic wave resonator, an IDT electrode is separated from reflectors disposed on both sides of the IDT electrode by a space. A reflector of a first acoustic wave resonator is electrically connected to one busbar of the first acoustic wave resonator.

In an acoustic wave device disclosed in Japanese Patent No. 5562063, among the three acoustic wave resonators, an IDT electrode of a centrally located acoustic wave resonator is electrically connected to IDT electrodes of acoustic wave resonators located on both sides of the acoustic wave resonator. In acoustic wave resonators, when power is applied, temperature tends to rise in the IDT electrodes. In particular, the IDT electrode of the central acoustic wave resonator is disposed between the IDT electrodes of the acoustic wave resonators on the both sides, and thus heat does not dissipate easily. Therefore, in the IDT electrode of the central acoustic wave resonator, temperature tends to rise, and electrochemical migration is likely to occur. For this reason, the electric power handling capability of the entire acoustic wave device decreases.

SUMMARY OF THE INVENTION

Preferred embodiments of the present invention provide acoustic wave devices and ladder filters each including one of the acoustic wave devices so as to improve electric power handling capability.

An acoustic wave device according to a preferred embodiment of the present invention includes a first acoustic wave resonator including a first IDT electrode, and a pair of reflectors disposed on both sides of the first IDT electrode in an acoustic wave propagation direction thereof; a second acoustic wave resonator connected in series with the first acoustic wave resonator and including a second IDT electrode, and a pair of reflectors disposed on both sides of the second IDT electrode in the acoustic wave propagation direction thereof; and a third acoustic wave resonator connected in series with the second acoustic wave resonator and including a third IDT electrode, and a pair of reflectors disposed on both sides of the third IDT electrode in the acoustic wave propagation direction thereof. Each of the first to third IDT electrodes includes a pair of busbars facing each other in a direction intersecting the acoustic wave propagation direction. The first acoustic wave resonator is disposed on one side of the second acoustic wave resonator in the direction intersecting the acoustic wave propagation direction, and the third acoustic wave resonator is disposed on another side in the direction intersecting the acoustic wave propagation direction. Another busbar of the first IDT electrode and one busbar of the second IDT electrode define and function as a first common busbar that is shared. Another busbar of the second IDT electrode and one busbar of the third IDT electrode define and function as a second common busbar that is shared. The first common busbar is connected to any reflector of the first and second acoustic wave resonators. The second common busbar is connected to any reflector of the second and third acoustic wave resonators.

In an acoustic wave device according to a preferred embodiment of the present invention, the reflectors adjacent to each other in the direction intersecting the acoustic wave propagation direction are connected by a conductive pattern along the acoustic wave propagation direction of each reflector.

In an acoustic wave device according to a preferred embodiment of the present invention, the first common busbar is connected to the reflector disposed on one side in the acoustic wave propagation direction, and the second common busbar is connected to the reflector disposed on another side in the acoustic wave propagation direction.

In an acoustic wave device according to a preferred embodiment of the present invention, in the first to third acoustic wave resonators, in the direction intersecting the acoustic wave propagation direction, each of the busbars is connected alternately to reflectors facing each other in the acoustic wave propagation direction.

In an acoustic wave device according to a preferred embodiment of the present invention, at least one fourth acoustic wave resonator is connected in series with the third acoustic wave resonator, the at least one fourth acoustic wave resonator includes a fourth IDT electrode, and a pair of reflectors disposed on both sides of the fourth IDT electrode in the acoustic wave propagation direction thereof, the fourth IDT electrode includes a pair of busbars, and, in a portion in which the third acoustic wave resonator and the fourth acoustic wave resonator are connected in series with each other, the reflector of the third acoustic wave resonator and a reflector of the fourth acoustic wave resonator are connected to each other.

In an acoustic wave device according to a preferred embodiment of the present invention, in the first to fourth acoustic wave resonators, in the direction intersecting the acoustic wave propagation direction, the busbars of the first to fourth acoustic wave resonators are connected alternately to the reflector on one side and the reflector on another side in the acoustic wave propagation direction.

In an acoustic wave device according to a preferred embodiment of the present invention, the direction intersecting the acoustic wave propagation direction is a direction intersecting the acoustic wave propagation direction at right angles or approximate right angles.

A ladder filter according to a preferred embodiment of the present invention includes a series arm resonator and a parallel arm resonator that are each defined by an acoustic wave resonator, and at least one of the series arm resonator and the parallel arm resonator is an acoustic wave device according to a preferred embodiment of the present invention.

The acoustic wave devices and the ladder filters according to preferred embodiments of the present invention enable improved electric power handling capability.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Specific preferred embodiments of the present invention will be described below with reference to the drawings.

It is noted that preferred embodiments described in the present description are illustrative, and it is noted that configurations may be partially replaced or combined with each other between different preferred embodiments.

Figure 1:
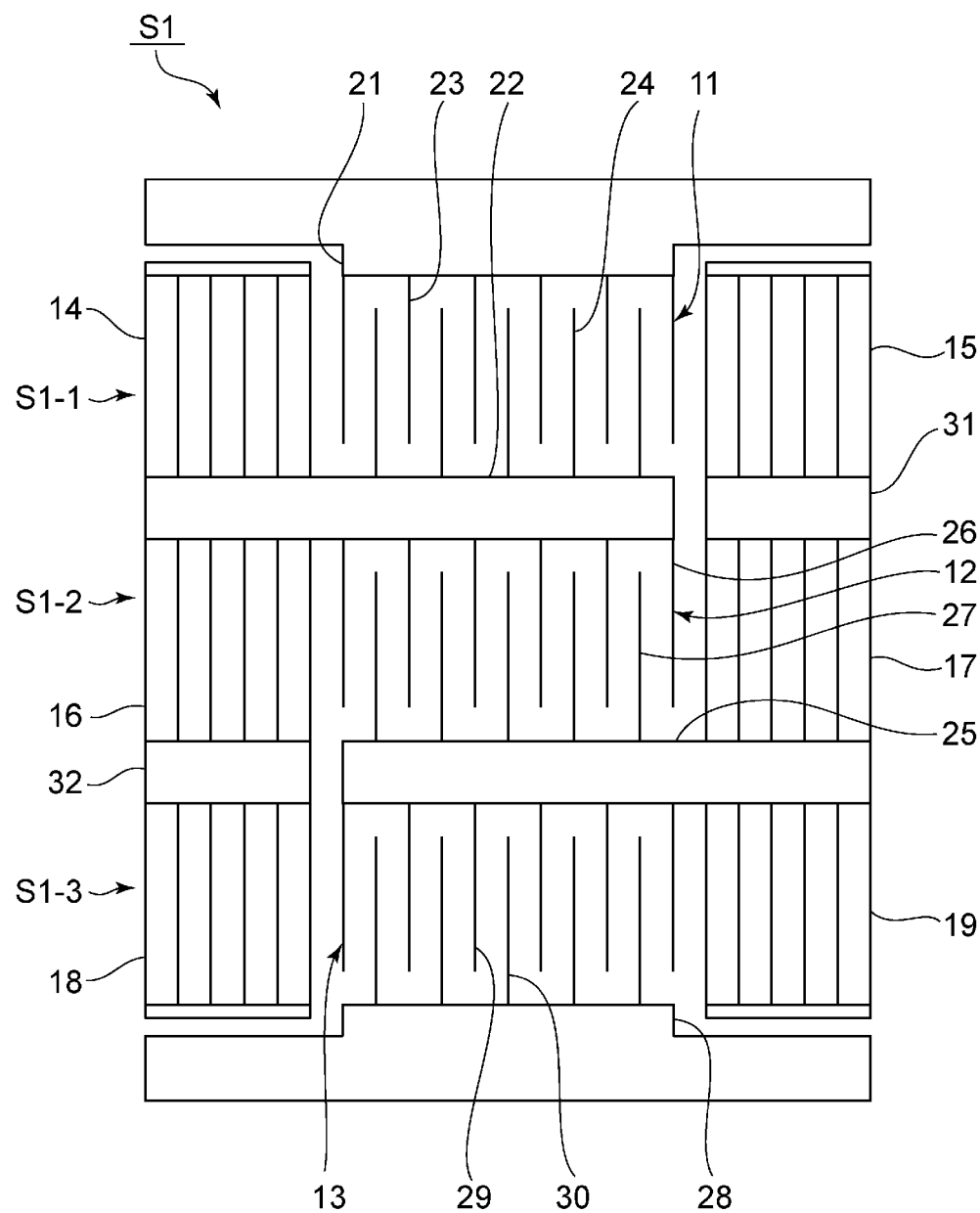
FIG. 1 is a plan view illustrating an electrode structure of an outermost series arm resonator located on a transmission terminal side in an acoustic wave device according to a first preferred embodiment of the present invention.
Figure 2:
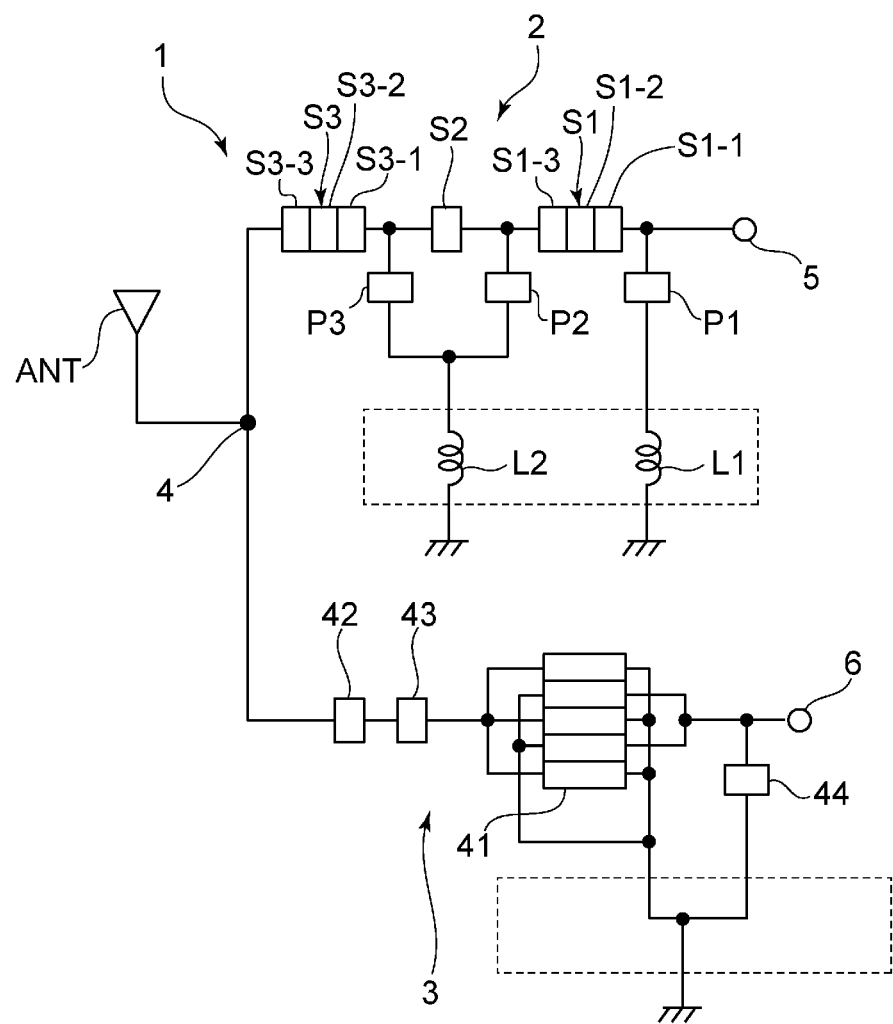
FIG. 2 is a circuit diagram of the acoustic wave device according to the first preferred embodiment of the present invention.

FIG. 1 is a plan view illustrating an electrode structure of an outermost series arm resonator located on a transmission terminal side in an acoustic wave device according to a first preferred embodiment of the present invention. FIG. 2 is a circuit diagram of the acoustic wave device according to the first preferred embodiment, and FIG. 3 is a plan view of the acoustic wave device.

Figure 3:
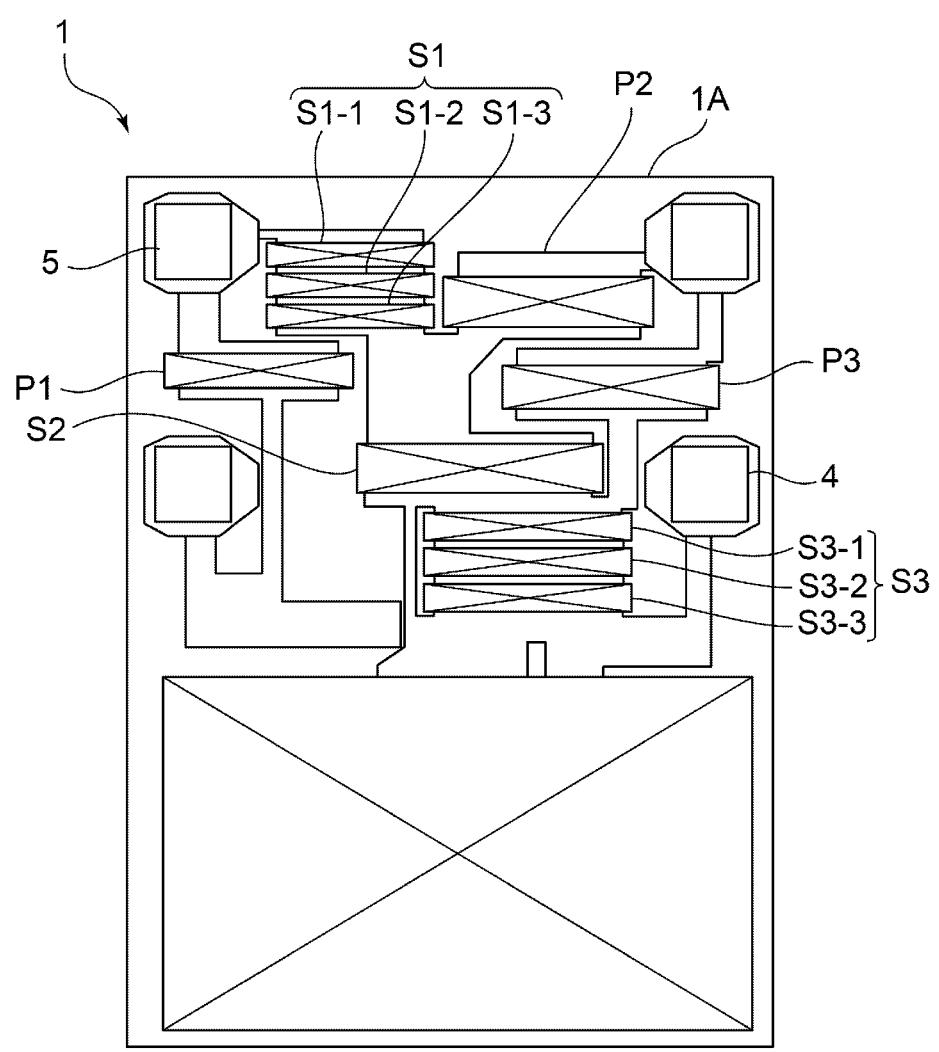
FIG. 3 is a plan view of the acoustic wave device according to the first preferred embodiment of the present invention.

As illustrated in FIGS. 2 and 3, an acoustic wave device 1 is, for example, a duplexer including a transmission filter 2 and a reception filter 3. As illustrated in FIG. 3, the acoustic wave device 1 includes a piezoelectric substrate 1A. As a material of the piezoelectric substrate 1A, a piezoelectric single crystal, such as LiTaO$_3$ or LiNbO$_3$, or piezoelectric ceramics, for example, may preferably be used.

The acoustic wave device 1 includes an antenna terminal 4. The antenna terminal 4 connected to an antenna ANT. The transmission filter 2 is connected between the antenna terminal 4 and a transmission terminal 5. The reception filter 3 is connected between the antenna terminal 4 and a reception terminal 6. In the transmission filter 2, transmission power is input from the transmission terminal 5, and the transmission power is output from the antenna ANT through the antenna terminal 4. In the reception filter 3, a signal input from the antenna ANT is extracted from the reception terminal 6.

The transmission filter 2 is preferably a ladder filter, for example. That is, the transmission filter 2 includes a plurality of series arm resonators S1 to S3, and a plurality of parallel arm resonators P1 to P3. An inductor L1 is connected between the parallel arm resonator P1 and a ground potential. Furthermore, a common connection is provided between ground potential-side end portions of the parallel arm resonators P2 and P3, and is connected to the ground potential through an inductor L2.

As schematically illustrated in FIG. 2, the series arm resonator S1 is divided into a plurality of series arm resonators S1-1 to S1-3, and the series arm resonator S3 is divided into a plurality of series arm resonators S3-1 to S3-3.

FIG. 1 illustrates a portion in which the series arm resonators S1-1 to S1-3 are connected in series. The series arm resonator S1 is an acoustic wave device according to a preferred embodiment of the present invention. Here, the series arm resonators S1-1 to S1-3 are first to third series arm resonators S1-1 to S1-3, defining and functioning as first to third acoustic wave resonators.

The first to third series arm resonators S1-1 to S1-3 respectively include first to third IDT electrodes 11 to 13. In the first series arm resonator S1-1, reflectors 14 and 15 are provided on both sides of the first IDT electrode 11 in an acoustic wave propagation direction. In the second series arm resonator S1-2, reflectors 16 and 17 are provided on both sides of the second IDT electrode 12 in the acoustic wave propagation direction. In the third series arm resonator S1-3, reflectors 18 and 19 are provided on both sides of the third IDT electrode 13 in the acoustic wave propagation direction.

The first IDT electrode 11 includes a first busbar 21 and a first common busbar 22. A plurality of first electrode fingers 23 are connected to the first busbar 21. A plurality of second electrode fingers 24 are connected to the first common busbar 22. The first common busbar 22 is shared between the first and second IDT electrodes 11 and 12. The second IDT electrode 12 includes a second common busbar 25 facing the first common busbar 22. A plurality of electrode fingers 26 are connected to the first common busbar 22, and a plurality of electrode fingers 27 are connected to the second common busbar 25.

The second common busbar 25 is shared between the second series arm resonator S1-2 and the third series arm resonator S1-3. In the third IDT electrode 13, a second busbar 28 is provided so as to face the second common busbar 25. A plurality of electrode fingers 29 are connected to the second common busbar 25, and a plurality of electrode fingers 30 are connected to the second busbar 28.

The first to third series arm resonators S1-1 to S1-3, which define and function as the first to third acoustic wave resonators, are disposed along a direction intersecting the acoustic wave propagation direction at right angles or approximate right angles. That is, on one side of the second series arm resonator S1-2 in the direction intersecting the acoustic wave propagation direction at right angles or approximate right angles, the first series arm resonator S1-1 is disposed, and, on the other side, the third series arm resonator S1-3 is disposed. In this case, a direction along which the first to third series arm resonators S1-1 to S1-3 are disposed is not limited to the direction intersecting the acoustic wave propagation direction at right angles or approximate right angles. That is, the first to third acoustic wave resonators may be sequentially disposed in a direction intersecting the acoustic wave propagation direction at an angle other than 90° or about 90°.

The first to third series arm resonators S1-1 to S1-3 are connected in series. Thus, the first IDT electrode 11 to the third IDT electrode 13 are connected in series. Specifically, the first IDT electrode 11 and the second IDT electrode 12 are connected by the first common busbar 22 defined by a strip-shaped conductive pattern. The second IDT electrode 12 and the third IDT electrode 13 are connected by the second common busbar 25 defined by a strip-shaped conductive pattern.

Additionally, the reflectors 14 and 16 are electrically connected to the first common busbar 22. The reflectors 15 and 17 are also electrically connected by a strip-shaped conductive pattern 31. That is, of the first series arm resonator S1-1 and the second series arm resonator S1-2, reflectors adjacent to each other in the direction intersecting the acoustic wave propagation direction at right angles or approximate right angles are connected by the first common busbar 22 or the conductive pattern 31.

Similarly, of the second series arm resonator S1-2 and the third series arm resonator S1-3 as well, reflectors adjacent to each other in the direction intersecting the acoustic wave propagation direction at right angles or approximate right angles are electrically and physically connected by a conductive pattern 32 or the second common busbar 25.

For example, when transmission power is applied to the series arm resonator S1 from the transmission terminal 5 illustrated in FIG. 2, the first IDT electrode 11 to the third IDT electrode 13 generate heat. In the related art, in this type of acoustic wave device, heat tends to build up, or be confined in a centrally located IDT electrode.

On the other hand, in the present preferred embodiment, the second IDT electrode 12 is connected to the reflectors 14 and 16 by the first common busbar 22. Furthermore, the second IDT electrode 12 is connected to the reflectors 17 and 19 by the second common busbar 25. Thus, even if temperature rises in the second IDT electrode 12, heat is able to escape to the outside through the first common busbar 22 and the second common busbar 25. Therefore, the temperature of the second IDT electrode 12 is able to be effectively prevented from rising. Accordingly, electrochemical migration does not occur easily, thus improving electric power handling capability.

As illustrated in FIG. 2, in the acoustic wave device 1, the structure according to the present preferred embodiment is used in the series arm resonator S1 closest to the transmission terminal 5. As illustrated in FIG. 3, the series arm resonator S3 illustrated in FIG. 2 is similarly divided into three series arm resonators S3-1, S3-2, and S3-3. In the series arm resonator S3 as well, the same or substantially the same structure as that in the series arm resonator S1 may preferably be provided. This further prevents the temperature from rising.

In the transmission filter 2, a series arm resonator to which the maximum power is applied is the series arm resonator S1 closest to the transmission terminal 5. Thus, the acoustic wave device according to the present preferred embodiment of the present invention is used for the series arm resonator S1, thus effectively improving electric power handling capability.

The electrode structure according to present preferred embodiment of the present invention may be used only in the series arm resonator S3 in place of the series arm resonator S1.

The reception filter 3 preferably includes a longitudinally coupled resonator acoustic wave filter 41, for example. Series arm resonators 42 and 43 are connected between the antenna terminal 4 and the longitudinally coupled resonator acoustic wave filter 41. Furthermore, a parallel arm resonator 44 is connected between a connection point between the longitudinally coupled resonator acoustic wave filter 41 and the reception terminal 6 and the ground potential. The circuit configuration of the reception filter 3 is not limited to a particular circuit configuration.

Although the electrode structure of the acoustic wave device according to the present preferred is used in the series arm resonator S1, the acoustic wave device according to the present preferred embodiment may be used for any portion in which the first to third acoustic wave resonators are connected in series. For example, in FIG. 3, the series arm resonator S2, and the series arm resonators S3-1 and S3-2 are connected in series and disposed in a line on the piezoelectric substrate. In this portion, the series arm resonator S3-1 defines and functions as the second acoustic wave resonator, and the electrode structure illustrated in FIG. 1 may be used.

Next, a specific experimental example will be described.

Figure 4:
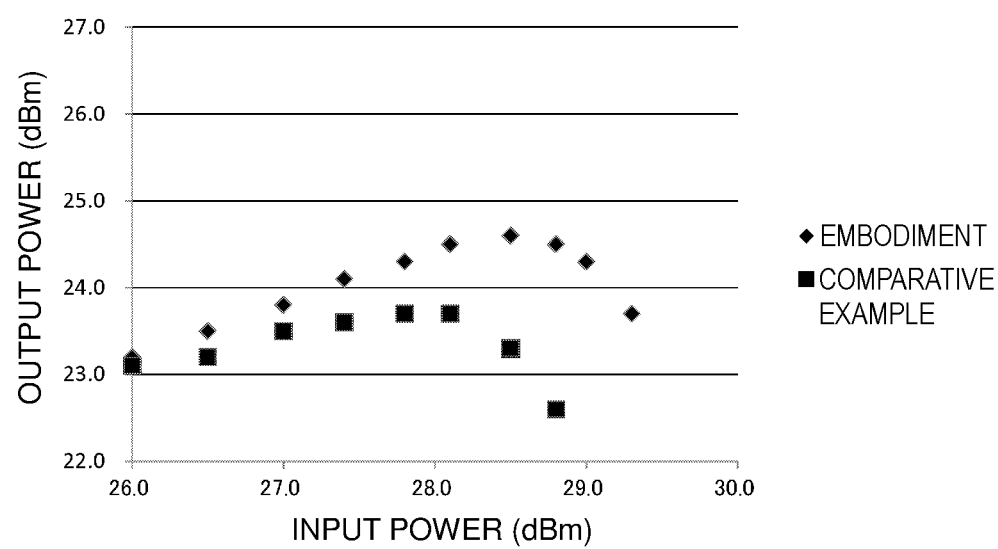
FIG. 4 illustrates relationships between input power and output power in acoustic wave devices according to the first preferred embodiment of the present invention and a comparative example.

FIG. 4 illustrates relationships between input power and output power in acoustic wave devices according to the first preferred embodiment and a comparative example. In the acoustic wave device according to the first preferred embodiment, input power refers to power input from the transmission terminal 5, and output power refers to power output from the antenna terminal 4.

The first preferred embodiment includes the electrode structure illustrated in FIG. 1. On the other hand, in the acoustic wave device according to the comparative example, as in the acoustic wave device disclosed in Japanese Patent No. 5562063, although reflectors of first to third acoustic wave resonators are connected to each other, a second IDT electrode is separated from reflectors disposed on both sides thereof. The remaining configuration of the acoustic wave device according to the comparative example is the same or substantially the same as the acoustic wave device according to the first preferred embodiment.

Design parameters of the first to third series arm resonators S1-1 to S1-3 are as follows.

Piezoelectric substrate: $LiTaO_3$ substrate with a cut-angle of about 42°. A leaky wave is used.

Number of pairs of electrode fingers of each of the first to third IDT electrodes 11 to 13=100 pairs, electrode finger pitch=about 2.634 μm, and electrode finger material and film thickness=Ti (about 6 nm)/Al (about 244 nm).

Number of pairs of electrode fingers of each of the reflectors 14, 16, 18, 15, 17, and 19=6.5 pairs, and electrode finger pitch=about 2.634μ m.

Furthermore, relationships between input power and output power in the comparative example and the first preferred embodiment that are described above are indicated in the following Table 1 and Table 2. Table 1 indicates results in the comparative example, and Table 2 indicates results in the preferred embodiment.

TABLE 1

| input power (dBm) | output power (dBm) |
|---|---|
| 26.0 | 23.1 |
| 26.5 | 23.2 |
| 27.0 | 23.5 |
| 27.4 | 23.6 |
| 27.8 | 23.7 |
| 28.1 | 23.7 |
| 28.5 | 23.3 |
| 28.8 | 22.6 |
| 29.0 | 19.4 |

TABLE 2

| input power (dBm) | output power (dBm) |
|---|---|
| 26.0 | 23.2 |
| 26.5 | 23.5 |
| 27.0 | 23.8 |
| 27.4 | 24.1 |
| 27.8 | 24.3 |
| 28.1 | 24.5 |
| 28.5 | 24.6 |
| 28.8 | 24.5 |
| 29.0 | 24.3 |
| 29.3 | 23.7 |
| 29.5 | 17.1 |

As indicated in Table 1 and FIG. 4, in the comparative example, output power reaches a peak in a region below an input power of about 28.0 dBm, and output power decreases rapidly when the input power exceeds about 28.0 dBm.

In comparison with this, as indicated in Table 2 and FIG. 4, the results in the present preferred embodiment reveal that output power increases even when input power is increased and exceeds about 28.0 dBm. Furthermore, the output power is above about 24.0 dBm in a region above an input power of about 28.0 dBm. Thus, in comparison with the comparative example, it was discovered that, in the present preferred embodiment, heat dissipation is improved, or deterioration of characteristics due to the application of input power is reduced, and that transmission power is able to be increased.

Furthermore, in Table 1 and FIG. 4, with respect to the comparative example, the reason why a region higher than an input power of about 29.0 dBm is not indicated is that damage was caused when the input power exceeded about 29.0 dBm and that output power was not able to be extracted. Thus, in comparison with the comparative example, it was discovered that the present preferred embodiment effectively improves electric power handling capability.

Figure 5:
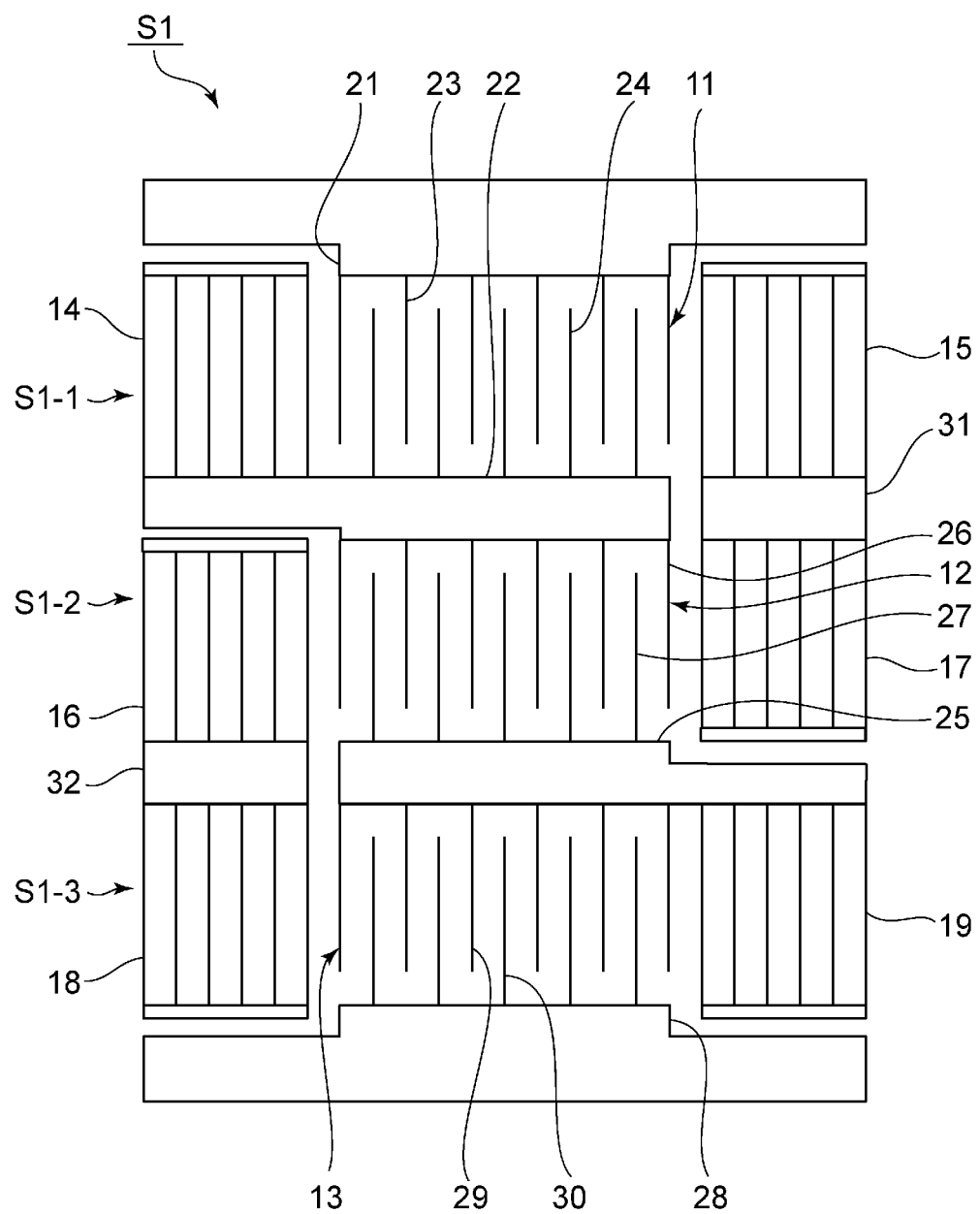
FIG. 5 is a plan view illustrating an electrode structure of the outermost series arm resonator located on the transmission terminal side in the acoustic wave device according to a modification of the first preferred embodiment of the present invention.

FIG. 5 is a plan view illustrating an electrode structure of the outermost series arm resonator located on the transmission terminal side in the acoustic wave device according to a modification of the first preferred embodiment. In the modification illustrated in FIG. 5, the first common busbar 22 is connected to the reflector 14 of the series arm resonator S1-1, defining and functioning as the first acoustic wave resonator, and is not connected to the reflector 16. Furthermore, the second common busbar 25 is connected to the reflector 19 of the series arm resonator S1-3, defining and functioning as the third acoustic wave resonator, and is not connected to the reflector 17. Thus, the first common busbar 22 and the second common busbar 25 do not have to be connected to the reflectors of the second acoustic wave resonator.

Except for the points described above, the modification is the same or substantially the same as the acoustic wave device according to the first preferred embodiment.

Contrary to the above-described modification, the first common busbar 22 is not connected to the reflector 14 and may be connected to the reflector 16. Similarly, the second common busbar 25 is not connected to the reflector 19 and may be connected to the reflector 17. That is, in preferred embodiments of the present invention, a first common busbar only has to be connected to any reflector of the first and second acoustic wave resonators, and a second common busbar only has to be connected to any reflector of the second and third acoustic wave resonators.

Figure 6:
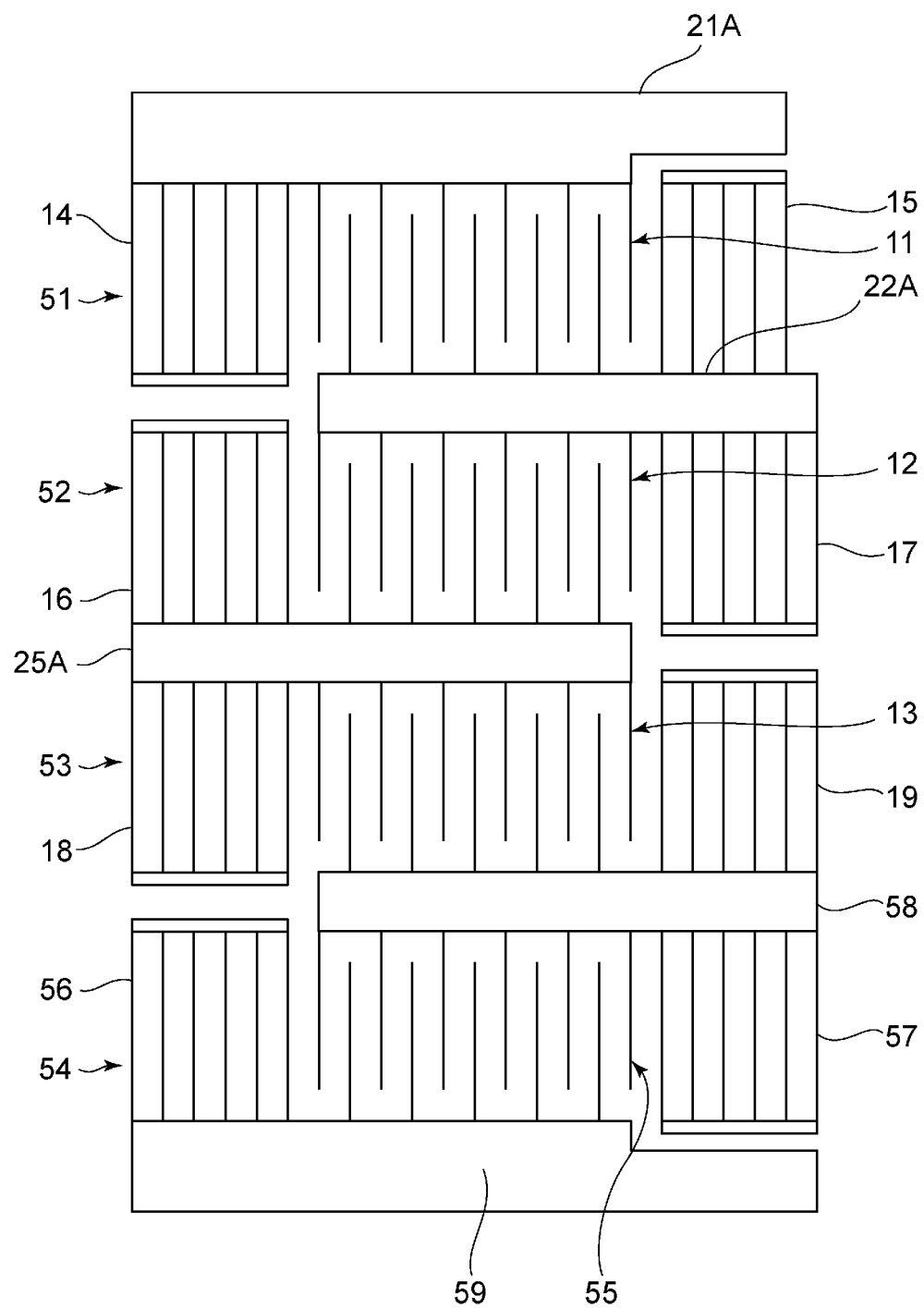
FIG. 6 is a plan view illustrating an electrode structure of an outermost series arm resonator located on a transmission terminal side in an acoustic wave device according to a second preferred embodiment of the present invention.

In the first preferred embodiment, three acoustic wave resonators are connected in series. In a second preferred embodiment of the present invention illustrated in FIG. 6, a fourth acoustic wave resonator 54 may preferably be connected in series in addition to first to third acoustic wave resonators 51 to 53. Thus, in the second preferred embodiment, at least one fourth acoustic wave resonator 54 may be further connected in series.

In the second preferred embodiment, the fourth acoustic wave resonator 54 includes a fourth IDT electrode 55, and reflectors 56 and 57 disposed on both sides of the fourth IDT electrode 55 in the acoustic wave propagation direction. The fourth IDT electrode 55 includes a third common busbar 58 and a busbar 59. The third common busbar 58 is shared between the third IDT electrode 13 and the fourth IDT electrode 55.

In the second preferred embodiment, the first IDT electrode 11 is connected to the reflector 14 by a busbar 21A. The first IDT electrode 11 is connected to the reflector 15 by a first common busbar 22A. The second IDT electrode 12 and the reflector 17 are connected by the first common busbar 22A. The second IDT electrode 12 and the reflector 16 are connected by a second common busbar 25A. The third IDT electrode 13 and the reflector 18 are connected by the second common busbar 25A. The third IDT electrode 13 and the reflector 19 are connected by the third common busbar 58.

Thus, the second IDT electrode 12 and the third IDT electrode 13 that are located in an inner position in the direction intersecting the acoustic wave propagation direction at right angles or approximate right angles and in which heat tends to build up, or be confined are respectively connected to the reflectors 15, 16, and 17 and to the reflectors 18, 19, and 57 by the first and second common busbars 22A and 25A and by the second and third common busbars 25A and 58. Therefore, in the second preferred embodiment as well, the temperatures of the second IDT electrode and the third IDT electrode 13 do not rise easily, thus effectively improving electric power handling capability as in the first preferred embodiment.

In the second preferred embodiment, in the configuration in which the first to fourth acoustic wave resonators 51 to 54 are connected in series, in the direction intersecting the acoustic wave propagation direction at right angles or approximate right angles, the busbar 21A, the first, second, and third common busbars 22A, 25A, and 58, and the busbar 59 are connected alternately to the reflectors 14, 16, 18, and 56 on one side and the reflectors 15, 17, 19, and 57 on the other side in the acoustic wave propagation direction. Thus, as described above, the temperatures of the second and third IDT electrodes 12 and 13 are able to be effectively prevented from rising.

Figure 7:
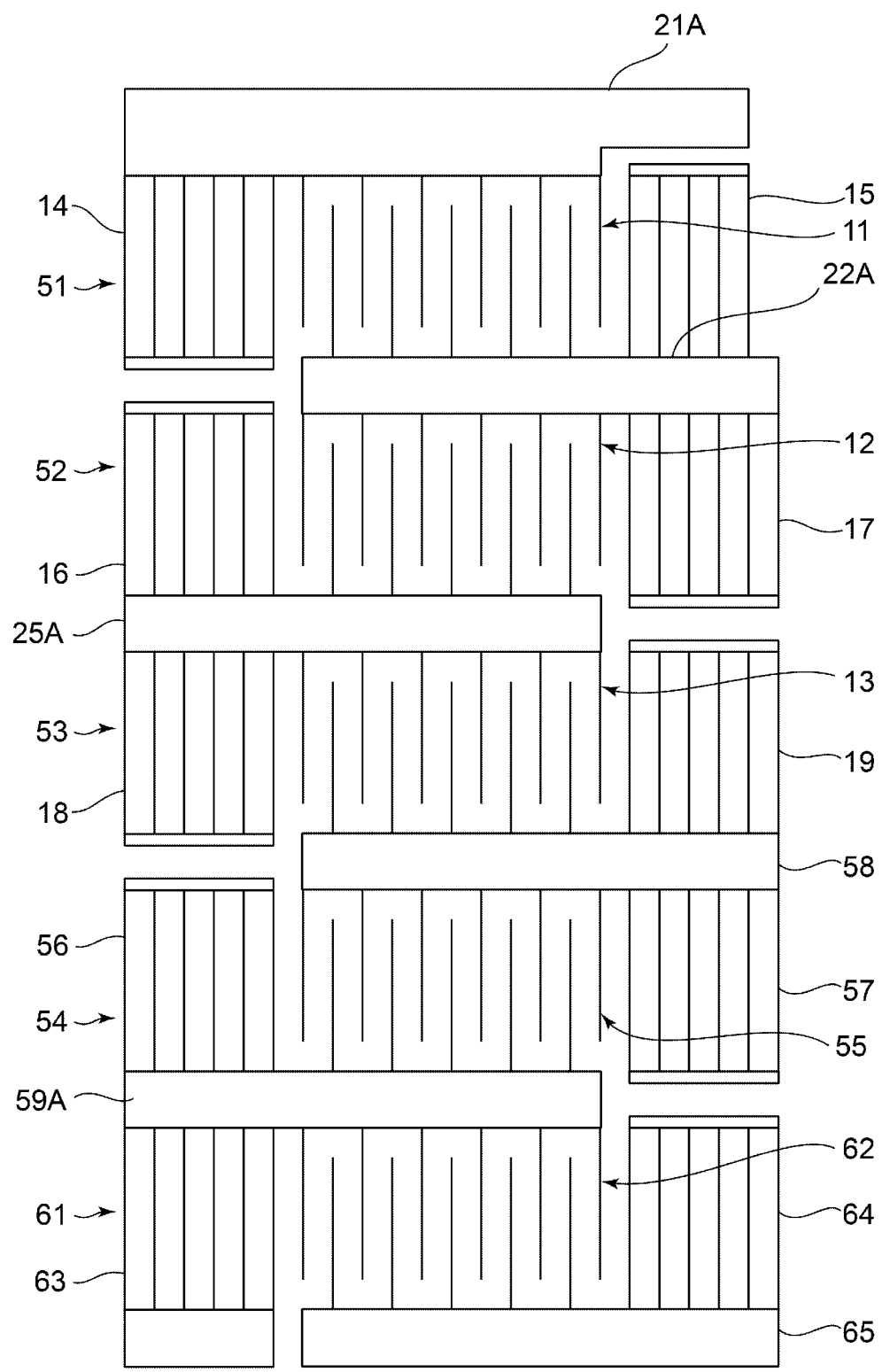
FIG. 7 is a plan view illustrating an electrode structure of an outermost series arm resonator located on a transmission terminal side in an acoustic wave device according to a third preferred embodiment of the present invention.

FIG. 7 is a plan view illustrating an electrode structure of an outermost series arm resonator located on a transmission terminal side in an acoustic wave device according to a third preferred embodiment of the present invention. In the acoustic wave device according to the third preferred embodiment, another fourth acoustic wave resonator 61 is connected in series with the fourth acoustic wave resonator 54 in the acoustic wave device according to the second preferred embodiment. The fourth acoustic wave resonator 61 includes an IDT electrode 62, and reflectors 63 and 64. A fourth common busbar 59A is shared between the fourth acoustic wave resonator 54 and the fourth acoustic wave resonator 61. The fourth IDT electrode 55 is connected to the reflectors 19 and 57 by the third common busbar 58. Furthermore, the IDT electrode 55 is connected to the reflector 63 by the fourth common busbar 59A. Thus, in the fourth IDT electrode 55, temperature is able to be prevented from rising.

The IDT electrode 62 and the reflector 64 of the fourth acoustic wave resonator 61 are connected by a busbar 65.

As in the series arm resonator illustrated in FIG. 7, a plurality of fourth acoustic wave resonators 54 and 61 may be connected in series.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
    a first acoustic wave resonator including a first IDT electrode, and a pair of reflectors disposed on both sides of the first IDT electrode in an acoustic wave propagation direction thereof;
    a second acoustic wave resonator connected in series with the first acoustic wave resonator and including a second IDT electrode, and a pair of reflectors disposed on both sides of the second IDT electrode in the acoustic wave propagation direction; and
    a third acoustic wave resonator connected in series with the second acoustic wave resonator and including a third IDT electrode, and a pair of reflectors disposed on both sides of the third IDT electrode in the acoustic wave propagation direction; wherein
    each of the first, second and third IDT electrodes includes a pair of busbars facing each other in a direction intersecting the acoustic wave propagation direction;
    the first acoustic wave resonator is disposed on one side of the second acoustic wave resonator in the direction intersecting the acoustic wave propagation direction, and the third acoustic wave resonator is disposed on another side in the direction intersecting the acoustic wave propagation direction;
    another busbar of the first IDT electrode and one busbar of the second IDT electrode define and function as a first common busbar that is shared;
    another busbar of the second IDT electrode and one busbar of the third IDT electrode defines and functions as a second common busbar that is shared; and
    the first common busbar is connected to any of the reflectors of the first and second acoustic wave resonators, and the second common busbar is connected to any of the reflectors of the second and third acoustic wave resonators.

2. The acoustic wave device according to claim 1, wherein the reflectors adjacent to each other in the direction intersecting the acoustic wave propagation direction are connected by a conductive pattern along the acoustic wave propagation direction of each of the reflectors.

3. The acoustic wave device according to claim 1, wherein the first common busbar is connected to the reflector disposed on one side in the acoustic wave propagation direction, and the second common busbar is connected to the reflector disposed on another side in the acoustic wave propagation direction.

4. The acoustic wave device according to claim 1, wherein, in the first, second and third acoustic wave resonators, in the direction intersecting the acoustic wave propagation direction, each of the busbars is connected alternately to reflectors facing each other in the acoustic wave propagation direction.

5. The acoustic wave device according to claim 1, wherein
    at least one fourth acoustic wave resonator is connected in series with the third acoustic wave resonator, the at least one fourth acoustic wave resonator includes a fourth IDT electrode, and a pair of reflectors disposed on both sides of the fourth IDT electrode in the acoustic wave propagation direction;
    the fourth IDT electrode includes a pair of busbars, and, in a portion in which the third acoustic wave resonator and the fourth acoustic wave resonator are connected in series with each other, the reflector of the third acoustic wave resonator and a reflector of the fourth acoustic wave resonator are connected to each other.

6. The acoustic wave device according to claim 5, wherein, in the first, second, third, and fourth acoustic wave resonators, in the direction intersecting the acoustic wave propagation direction, the busbars of the first, second, third, and fourth acoustic wave resonators are connected alternately to the reflector on one side and the reflector on another side in the acoustic wave propagation direction.

7. The acoustic wave device according to claim 5, wherein the at least one fourth acoustic wave resonator includes two fourth acoustic wave resonators.

8. The acoustic wave device according to claim 5, wherein the at least one fourth acoustic wave resonator includes only one fourth acoustic wave resonator.

9. The acoustic wave device according to claim 1, wherein the direction intersecting the acoustic wave propagation direction is a direction intersecting the acoustic wave propagation direction at right angles or approximate right angles.

10. A ladder filter comprising:
    a series arm resonator and a parallel arm resonator; wherein
    at least one of the series arm resonator and the parallel arm resonator is the acoustic wave device according to claim 1.

11. The ladder filter according to claim 10, wherein the reflectors adjacent to each other in the direction intersecting the acoustic wave propagation direction are connected by a conductive pattern along the acoustic wave propagation direction of each of the reflectors.

12. The ladder filter according to claim 10, wherein the first common busbar is connected to the reflector disposed on one side in the acoustic wave propagation direction, and the second common busbar is connected to the reflector disposed on another side in the acoustic wave propagation direction.

13. The ladder filter according to claim 10, wherein, in the first to third acoustic wave resonators, in the direction intersecting the acoustic wave propagation direction, each of the busbars is connected alternately to reflectors facing each other in the acoustic wave propagation direction.

14. The ladder filter according to claim 10, wherein
at least one fourth acoustic wave resonator is connected in series with the third acoustic wave resonator, the at least one fourth acoustic wave resonator includes a fourth IDT electrode, and a pair of reflectors disposed on both sides of the fourth IDT electrode in the acoustic wave propagation direction;
the fourth IDT electrode includes a pair of busbars, and, in a portion in which the third acoustic wave resonator and the fourth acoustic wave resonator are connected in series with each other, the reflector of the third acoustic wave resonator and a reflector of the fourth acoustic wave resonator are connected to each other.

15. The ladder filter according to claim 14, wherein, in the first, second, third, and fourth acoustic wave resonators, in the direction intersecting the acoustic wave propagation direction, the busbars of the first, second, third, and fourth acoustic wave resonators are connected alternately to the reflector on one side and the reflector on another side in the acoustic wave propagation direction.

16. The ladder filter according to claim 14, wherein the at least one fourth acoustic wave resonator includes two fourth acoustic wave resonators.

17. The ladder filter according to claim 14, wherein the at least one fourth acoustic wave resonator includes only one fourth acoustic wave resonator.

18. The ladder filter according to claim 10, wherein the direction intersecting the acoustic wave propagation direction is a direction intersecting the acoustic wave propagation direction at right angles or approximate right angles.

* * * * *